United States Patent [19]

Chance et al.

[11] 4,453,176

[45] Jun. 5, 1984

[54] LSI CHIP CARRIER WITH BURIED REPAIRABLE CAPACITOR WITH LOW INDUCTANCE LEADS

[75] Inventors: Dudley A. Chance, Danbury, Conn.; Gerard V. Kopcsay, Yorktown Heights, N.Y.

[73] Assignee: International Business Machines Corporation, Armonk, N.Y.

[21] Appl. No.: 336,485

[22] Filed: Dec. 31, 1981

[51] Int. Cl.³ .............................................. H01L 27/02
[52] U.S. Cl. ......................................... 357/51; 357/68; 357/70; 357/27
[58] Field of Search ......................... 357/51, 68, 70, 27

[56] References Cited

U.S. PATENT DOCUMENTS

| | | | |
|---|---|---|---|
| 3,740,619 | 6/1973 | Rosvold | 357/70 X |
| 3,748,548 | 7/1973 | Haisty et al. | 357/51 X |
| 4,288,841 | 9/1981 | Gogal | 357/70 X |
| 4,334,236 | 6/1982 | Hoffman et al. | 357/68 X |
| 4,360,823 | 11/1982 | van Gils | 357/68 |

OTHER PUBLICATIONS

Narken et al., "Low Capacitive Via Path Through High Dielectric Constant Material," *IBM Technical Disclosure Bulletin*, 22, No. 12, May 1980, pp. 5330-5331.

Lussow, Internal Capacitors and Resistors for Multilayer Ceramic Modules," *IBM Technical Disclosure Bulletin*, 20, No. 9, Feb. 1978, pp. 3436-3437.

*Primary Examiner*—Martin H. Edlow
*Assistant Examiner*—W. Mintel
*Attorney, Agent, or Firm*—Graham S. Jones, II

[57] ABSTRACT

A carrier for LSI chips includes a built-in capacitor structure in the carrier. The capacitor is located beneath the chip with the plates of the capacitor parallel to the chip mounting surface or at right angles to the chip mounting surface. The capacitor is formed by assembling an array of capacitive segments together to form the first one of the plates of a capacitor with the other plate spanning a plurality of the segments of the first plate. Each of the segments of the first plate includes a set of conductive via lines which extend up to a severable link on the chip mounting surface. The severable via is cut by means of a laser beam or the like when the capacitor must be repaired by deleting a defective segment of the capacitor. Preferably, the structure includes a pair of parallel conductive charge redistribution planes above and below the capacitor plates with connections to the respective plates providing a low inductance structure achieved by providing a current distribution which results in cancellation of magnetic flux. The lower redistribution plane is preferably connected directly to the lower capacitor plate. The upper redistribution plane is preferably connected to the segments of the first capacitor plate by means of the vias which extend first to the chip mounting surface and then down to the redistribution plane which has connections to the chip mounting pads.

9 Claims, 6 Drawing Figures

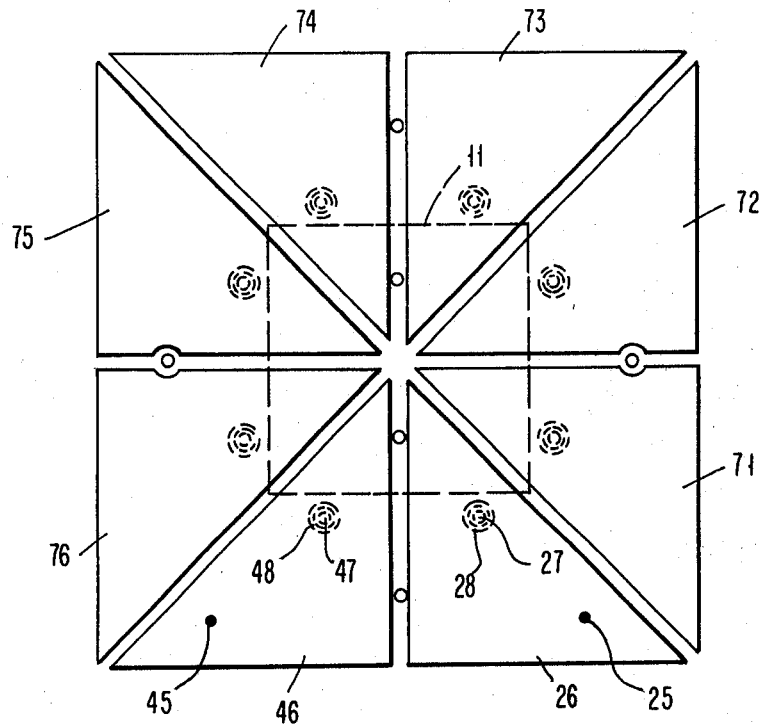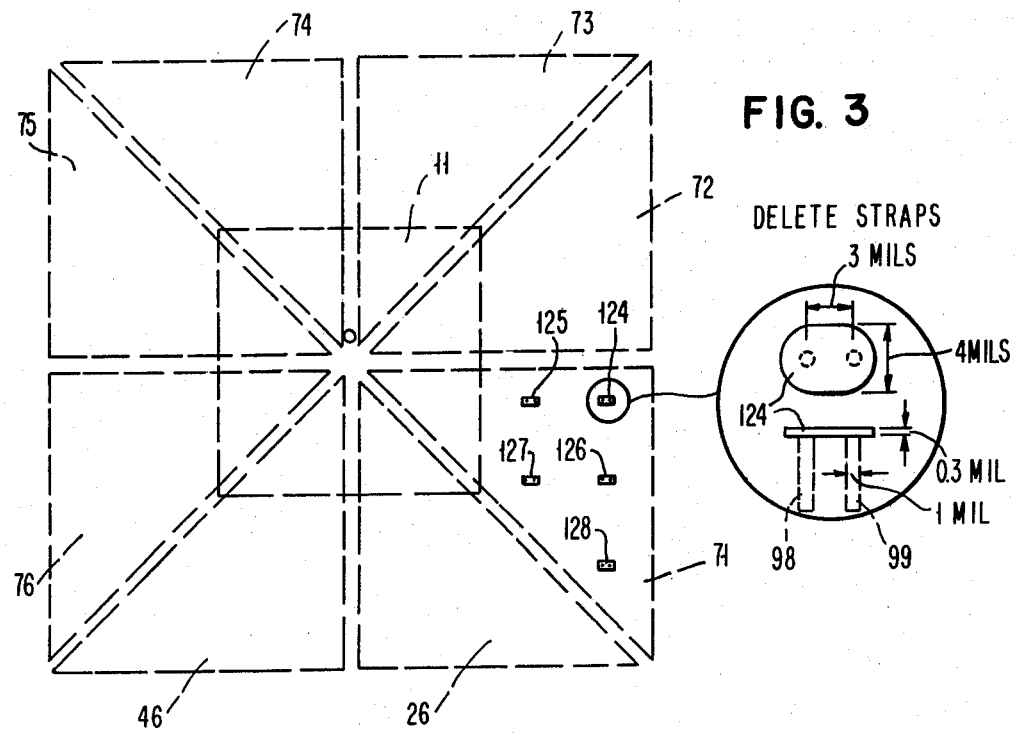

LSI CHIP CARRIER WITH BURIED REPAIRABLE CAPACITOR WITH LOW INDUCTANCE LEADS

BACKGROUND OF THE INVENTION

1. Field of the Invention

This invention relates to packaging of LSI chips and more particularly to the problem of providing capacitors with relatively high values located near the chips with ultra-low inductance connections between the chips and the capacitors.

2. Description of the Prior Art

Narken et al "Low Capacitive Via Path Through High Dielectric Constant Material" IBM Technical Disclosure Bulletin 22, No. 12, 5330-1 (May 1980) describes a decoupling capacitor located in a multilayer structure directly below a chip with vias extending through the dielectric material of the capacitors. The arrangement is intended to minimize the inductance of the structure.

Lussow "Internal Capacitors and Resistors for Multilayer Ceramic Modules" IBM Technical Disclosure Bulletin 20, No. 9, 3436-7 (February 1978) describes a multilayer ceramic module with capacitors incorporated within the green sheet structure.

No prior art has been found which suggests in any way the provision of the aligned connector wires extending in opposite directions in order to cancel out magnetic flux induced by currents in the leads to the capacitor. Nor does the prior art suggest the formation of a capacitor with multiple segments located within the body of the carrier connected in such a way that they are adapted for easy mechanical or laser deletion to alter the capacitance of the capacitor or to remove defects subsequent to fabrication.

SUMMARY OF THE INVENTION

Future high performance packages will require on-module decoupling capacitors to suppress simultaneous switching noise. Such capacitors should have minimum inductance, ideally zero inductance. The capacitor disclosed here has the lowest inductance of any other known solution. Its success critically requires being able to repair defects in the capacitor thin film portion of the capacitor, a key feature of this invention.

A carrier for any number of LSI chips includes a built-in capacitor structure in the carrier. The capacitor is located beneath the chip with the plates of the capacitor parallel or normal to the plane of the surface of the carrier. The capacitor is formed by assembling an array of capacitive segments in a plane preferably between a pair of parallel conductive charge redistribution planes, with one of a set of conductive via lines connected between one of the redistribution planes and deletable conductive junction areas upon the chip carrying surface of the carrier. The conductive planes are connected to opposite surfaces of the capacitor segments by means of aligned vias with one extending down from the conductive junction area connected to the top redistribution layer. The connection of the other aligned via to the bottom redistribution plane extends directly up to the lower surface of the capacitor segment from the bottom redistribution plane. Thus the capacitor segments are excited asymmetrically by the connections aligned from above and below the segment in opposing directions. In addition, the capacitor is composed of a substantial number of segments. The upper conductive junction areas can be deleted or severed to modify capacitance or to eliminate defective segments by deletion of metallic connections on the surface of the chip carrier. Similarly pin connections to segments to be eliminated can be broken by removal of the appropriate pins.

Further, in accordance with this invention a carrier for a large scale integrated circuit chip includes a built-in capacitor structure in the carrier, with the capacitor located beneath the chip with the parallel plates of the capacitor parallel to the plane of the surface of the carrier supporting said chip. The improvement comprises a capacitor formed of at least one capacitor segment sandwiched between a pair of parallel conductive charge redistribution planes with the segment and the planes extending substantially parallel to the surface of the carrier.

Preferably, the capacitor is formed from a plurality of interconnected capacitor segments located between the charge redistribution planes. Each of the capacitor segments is electrically connected to a separate connection link on the surface of the carrier. Each link is adapted for easy deletion of the connection between any defective segment of the capacitor and the remainder of the capacitor which is not defective but which is adequate.

Preferably, the carrier has an upper surface on which at least one chip is bonded. The carrier includes a capacitor structure located at a level below a chip site with the parallel plates of the capacitor extending within the body of the carrier. The capacitor is formed of a single capacitor segment forming a first plate and a plurality of capacitor segments forming a complementary segmented plate juxtaposed with the first plate, with each of a plurality of capacitor segments being connected by at least one via connected from that segment to a corresponding deletable strap connection on the upper surface of the carrier whereby a defective one of the capacitor segments can be eliminated from connection in any circuit in which it is included by means of an externally applied tool applied to the upper surface of said carrier.

Preferably, the capacitor segments are aligned substantially parallel to the upper surface of the carrier with each of the deletable straps being connected to a charge redistribution plane within the carrier, and a charge redistribution plane is located between the top surface and the capacitor segments forming the complementary segmented plate. A redistribution plane is located parallel to the plates below the complementary plate. The plates are located in planes normal to the top surface of the carrier. The capacitor structure is located directly below the chip site.

In another aspect of this invention, a method of fabrication of a carrier for a chip includes providing a substrate with pins and vias connected to a pair of capacitor plates within the carrier below the surface upon which the chip is mounted, with one of the capacitor plates being broken into segments, with each of the segments having a via connection reaching to the chip mounting surface to connect to a deletable strap connection to another via which connects to means for connection to a chip pad. Then one detects defects in the segments of the capacitor, and deletes connections at the straps for segments of the capacitor discovered to be defective, or excessive.

BRIEF DESCRIPTION OF THE DRAWINGS

FIG. 2 is a sectional view of a carrier in accordance with FIG. 1 with the segmented capacitor elements shown in a plan view with some of the interconnections thereto illustrated.

FIG. 3 is a plan view of the upper surface of the carrier of FIGS. 1 and 2 with only the deletable connection straps for a single capacitor segment illustrated.

DESCRIPTION OF THE PREFERRED EMBODIMENT

Figure 1:
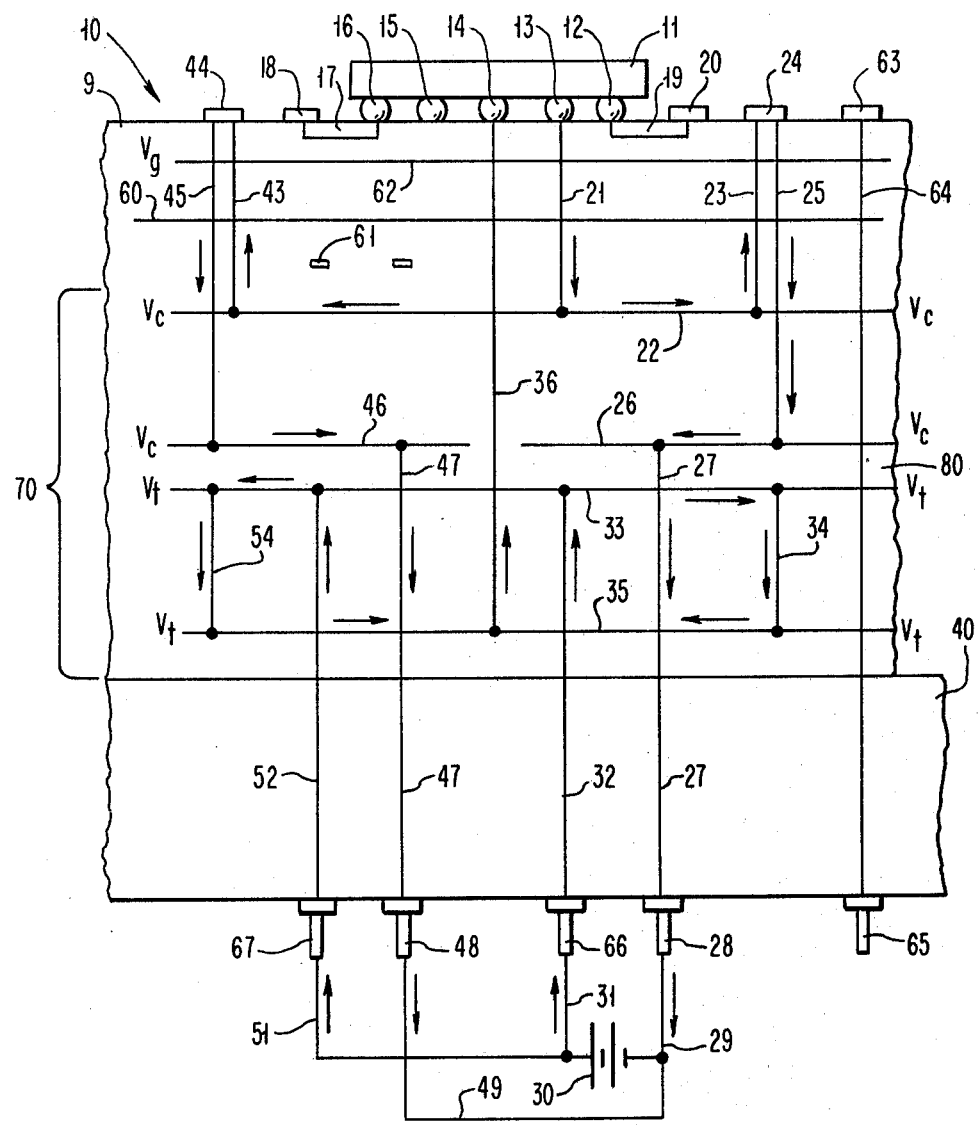
FIG. 1 shows a schematic diagram of the connections within a chip carrier with capacitive elements buried in the carrier with deletable strap connections in accordance with this invention.

FIG. 1 shows a schematic diagram of a fragment of a package or carrier 10 for LSI electronic circuit chips such as chip 11. The chip 11 is supported on the upper surface 9 of carrier 10. The support of chip 11 is provided by solder bonds 12, 13, 14, 15 and 16 which are representative of perhaps dozens of such solder ball bonds (C-4 joints) which mechanically support the chip 11 and provide electrical connections of both signals and power to the chip. This patent application is primarily concerned with the circuits for supplying power to the chip connections such as C-4 joints 13 and 14. Joint 13 is connected by means of via line 21 which extends down into the carrier 10 through layers of a dielectric material, such as multilayered glass, polymeric, glass-ceramic or ceramic material, to a redistribution plane 22 maintained at voltage $V_c$. Plane 22 is connected by means of via line 23 up to a deletable connection strap 24 located on surface 9 of carrier 10. Connection strap 24 is adapted to be severed as desired by the designer by means of laser deletion techniques or the like to disconnect plane 22 from via line 25 and capacitor plate segment 26 if there is a defect in that segment. Segment 26 is connected to an external source of bias voltage or power supply 30 by means of a power via 27 which extends down to pin 28. Pin 28 can also be removed from the system if, indeed, the segment 26 is defective. Pin 28 connects by means of line 29 to the negative power supply 30. The lower plate of the capacitor is plate 33 which extends beneath plate segment 26 on the right as well as plate segment 46 to the left of segment 26. Dielectric layer 80 is sandwiched between plate 33 and segments 26, 46, etc. The lower plate 33 is connected to the positive terminal of a D.C. power supply indicated by battery 30 through via 32 (or 52) and pin 66 (67) to wire 31 (51). The numerals in parentheses referring to elements in FIG. 1 are analogous to the numerals which precede the parentheses and they are located on the left side of the carrier 10 in FIG. 1. Capacitor segments 26 (46) are connected to the negative terminal of battery 30 by means of line 29 (or 49) to pin 28 (48) to line 27 (47). Thus a stable source of instantaneous voltage and power is made available nearer to the chip, in the interior of chip carrier 10. However, the connections to the chip are indirect in order that defective capacitive elements such as segment 26 or 46 can be disconnected, if required. Thus segment 26 (or 46) is connected by via line 25 (45) to a bridge connection 24 (44) which can be severed by laser deletion or the like. Bridge connection 24 (44) connects by via 23 (43) to a conductive plane 22 known as the charge redistribution plane $V_c$ which is connected to a C-4 joint 13 by means of via line 21. In fact a large number of C-4 joints connected to a given chip can be connected down to $V_c$ plane 22. Only one such connection is shown in FIG. 1 for convenience in illustration by minimizing complexity to increase the clarity of illustration of the relevant portions of the circuit.

The lower plate 33 of the capacitor is shown to be a single, integral whole although it can be segmented also, if desired. In any event, the connection of plate 33 at voltage $V_t$ is by means of via lines 34 and 54 which are widely spaced apart so as to distribute the current flow evenly to reduce inductive effects. Vias 34 and 54 connect to redistribution plane 35 also at voltage $V_t$. Connection of plane 35 to a given C-4 joint 14 is provided by via 36.

Pads 16 (and 12) are connected by means of fan-out lines 17 (and 19) to pads 18 (or 20). Such pads are useful for connection to external engineering change lines or to the connections in the x and y interconnection planes which are exemplified by lines 60 and 61 respectively. Such interconnections are well known in the art. The reference plane 62, $V_c$ plane 22 and lines 60 and 61 form strip conductive lines.

FIG. 2 shows a top view of the segments of the capacitor at voltage $V_c$ including segments 26 and 46 shown in a front view in FIG. 1 where their edges are seen. The vias 27 and 47 connected to the bottom of segments 26 and 46, respectively, are shown in phantom encircled by the phantom drawings of donut-shaped clearances of $V_t$ planes 33 and 35 and the pins 28 and 48 secured to the base of carrier 10, connected to vias 27 and 47, respectively, as described above. The other capacitor segments are 71, 72, 73, 74, 75, and 76. Thus this square capacitor plate is composed of eight triangular segments 26, 46, and 71-76. Any one of the segments can be disconnected from the circuit by eliminating elements such as pins 28 and 48 and such as connections by vias 25 and 45 to segments 26 and 46 and similar vias not shown for the other segments by cutting the straps 24 and/or 44 as described above.

Figure 4:
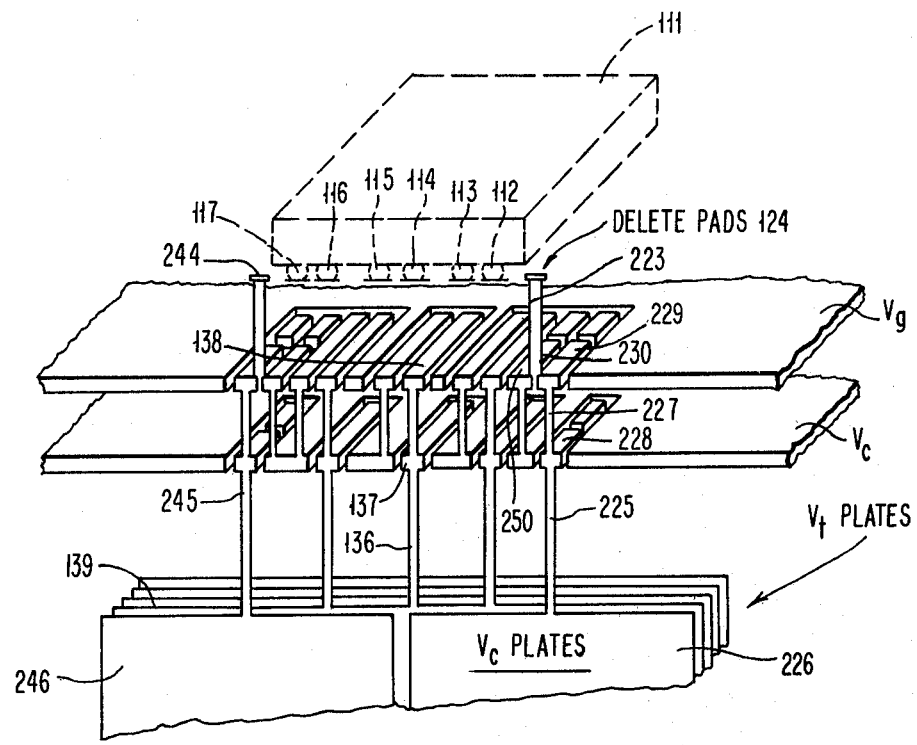
FIG. 4 is a perspective view of a segmented vertical capacitor arrangement in accordance with this invention with deletable straps or pads.

FIG. 3 shows a view looking down on surface 9 with only the connection strap metallurgy for segment 71 illustrated with the segments 26, 46 and 71-76 shown in phantom. The area beneath chip 11 is also shown in phantom. As can be seen there are five straps 124-128. In the inset, a deletable strap 124 is shown in top view at the top with the vias 98 and 99 shown in phantom about 0.003" apart with the pad or strap 124 about 0.004" wide and about 0.003" thick. In the lower view, the via 99 (below the strap 124) seen in an elevational view is shown to be about 0.001" in diameter. FIG. 4 is a perspective view of a section of a vertical capacitor arrangement taken along line FIG. 6—FIG. 6 in FIG. 5 in accordance with another aspect of this invention. The chip 111 and C-4 joints 112-117 are shown in phantom. A delete pad 124 is shown with vias 223 and 230 including via 230 connected to a bus bar 229. Bus bar 229 is connected by via 227 to bus bar 228 which connects to via 225 to a vertical capacitor plate 226 which is segmented and is at voltage $V_c$. Plates $V_c$ can be removed from operation in conjunction with the full plate 139 $V_t$ by laser deletion of deletable pad 124, etc. Another deletable pad 244 is shown on the left which connects by vias and bus bars to via 245 to plate 246. Bus bar 137 and via 136 connect to $V_t$ plate 139 of the capacitor.

Figure 5:
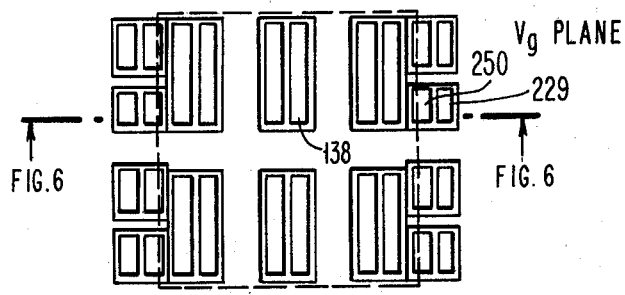
FIG. 5 is a sectional plan view of the connection bus bars of the carrier of FIG. 4.

FIG. 5 shows the bus bars 229 and 250 in a sectional plan view with the upper layers of the carrier in FIG. 4 removed.

Figure 6:
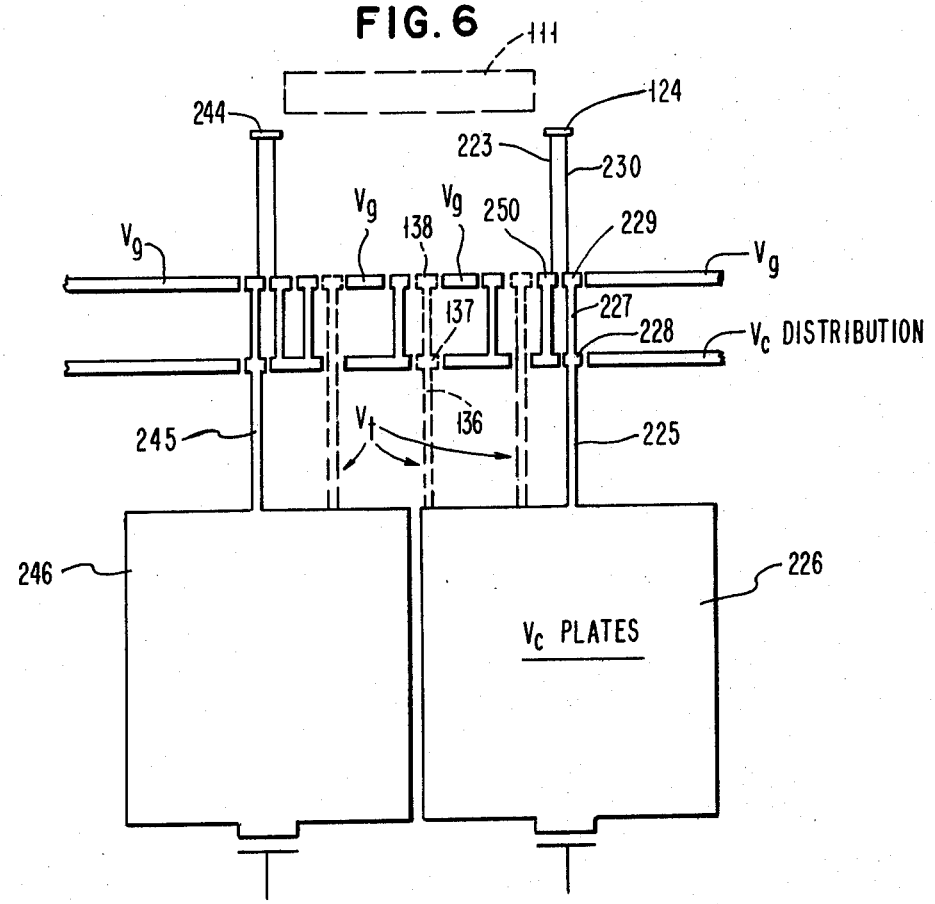
FIG. 6 is an elevational view of the structure of FIGS. 4 and 5 taken along the section in FIG. 5.

FIG. 6 is a sectional view taken along the section line in FIG. 5. The chip 111 is shown in phantom with the deletable strap 124 shown above the level $V_g$ and the via 225 shown connected to plate segment 226. Segment 246 is also shown in elevation, connected to via 245. Via 136 shown in phantom is adapted to be connected to the $V_t$ capacitor plate which is juxtaposed with segments to 226 and 246 separated therefrom by a layer of dielectric material.

Having thus described our invention, what we claim as new, and desire to secure by Letters Patent is:

1. In a carrier for a large scale integrated circuit chip including a built-in capacitor structure in the carrier, with the capacitor located beneath the chip with the parallel plates of the capacitor parallel to the plane of the surface of the carrier supporting said chip, the improvement comprising said capacitor formed of at least one capacitor segment sandwiched between a pair of parallel conductive charge redistribution planes with said segment and said planes extending substantially parallel to said surface of said carrier.

2. a carrier in accordance with claim 1 wherein said capacitor is formed from a plurality of interconnected segments located between said charge redistribution planes, with each of said segments being electrically connected to a separate connection link on the surface of said carrier, said link being adapted for easy deletion of the connection between defective segments of said capacitor from the remainder of said capacitor.

3. In a carrier for a large scale integrated circuit chip system, said carrier having an upper surface on which at least one chip is bonded, said carrier including a capacitor structure located at a level below a chip site with the parallel plates of the capacitor extending within the body of said carrier, the improvement comprising said capacitor being formed of a single capacitor segment forming a first plate and a plurality of capacitor segments forming a complementary segmented plate juxtaposed with said first plate, with each of said plurality of capacitor segments being connected by at least one via connected from said segment to a corresponding deletable strap connection on said upper surface of said carrier whereby a defective one of said capacitor segments can be eliminated from connection in any circuit in which it is included by means of an externally applied tool applied to said upper surface of said carrier.

4. In a carrier in accordance with claim 3, said capacitor segments being aligned substantially parallel to said upper surface of said carrier.

5. In a carrier in accordance with claim 3, with each of said deletable straps being connected to a charge redistribution plane within said carrier.

6. In a carrier in accordance with claim 5, said charge redistribution plane being located between said top surface and said capacitor segments forming said complementary segmented plate.

7. In a carrier in accordance with claim 6, a redistribution plane located parallel to said plates below said complementary plate.

8. In a carrier in accordance with claim 3, said plates being located in planes normal to said top surface of said carrier.

9. In a carrier in accordance with claim 3, wherein said capacitor structure is located directly below said chip site.

* * * * *